(12) United States Patent
Lin et al.

(10) Patent No.: US 8,786,333 B2
(45) Date of Patent: Jul. 22, 2014

(54) PHASE CALIBRATION DEVICE AND PHASE CALIBRATION METHOD

(71) Applicant: Realtek Semiconductor Corporation, Hsinchu (TW)

(72) Inventors: Jian Ru Lin, Nantou County (TW); Kai Yin Liu, Kaohsiung (TW)

(73) Assignee: Realtek Semiconductor Corporation, Hsinchu (TW)

(*) Notice: Subject to any disclaimer, the term of this patent is extended or adjusted under 35 U.S.C. 154(b) by 2 days.

(21) Appl. No.: 13/793,604

(22) Filed: Mar. 11, 2013

(65) Prior Publication Data

US 2014/0118038 A1 May 1, 2014

(30) Foreign Application Priority Data

Oct. 30, 2012 (TW) .............................. 101140035 A (51) Int. Cl.
H03L 7/06 (2006.01)
H03L 7/10 (2006.01)

(52) U.S. Cl.
CPC .................................... *H03L 7/105* (2013.01)
USPC .......................................... 327/149; 327/156

(58) Field of Classification Search
USPC ................. 327/141–150, 152, 153, 155–159, 327/161–163
See application file for complete search history.

(56) References Cited

U.S. PATENT DOCUMENTS

| 8,710,884 | B2 * | 4/2014 | Burg et al. ..................... 327/159 |
| 2011/0109359 | A1 * | 5/2011 | Greenberg et al. ........... 327/158 |
| 2011/0291713 | A1 * | 12/2011 | Park .............................. 327/155 |
| 2014/0097878 | A1 * | 4/2014 | Sindalovsky et al. ......... 327/156 |

* cited by examiner

Primary Examiner — Lincoln Donovan
Assistant Examiner — Diana J Cheng
(74) Attorney, Agent, or Firm — WPAT, P.C.; Anthony King (57) ABSTRACT

A phase calibration device comprises: an oscillator for generating a reference clock; a phase-lock-loop for generating an input clock by the reference clock; a multiphase clock generator for generating a plurality of output clocks by the input clock; a selector for selecting one of the output clocks as an operation clock; an analog-to-digital convertor for performing analog-to-digital conversion to input data by the operation clock to generate a conversion result; a control circuit for generating parameters according to the conversion result and controlling the selector to do selection; and a phase calibration circuit for outputting a calibration signal and the input clock of the phase-lock-loop to the multiphase clock generator after restarting the phase-lock-loop, so that the multiphase clock generator can correctly regenerate the output clocks by the calibration signal and the input clock, and then the control circuit controls the selector to do selection by the parameters.

12 Claims, 5 Drawing Sheets

PHASE CALIBRATION DEVICE AND PHASE CALIBRATION METHOD

BACKGROUND OF THE INVENTION

1. Field of the Invention

The present invention relates to a phase calibration device and a phase calibration method, especially to a phase calibration device and a phase calibration method applicable to a data recovery system.

2. Description of Related Art

Regarding the Ethernet network communication system, there is a clock generation circuit in each of the transmission end and the reception end. The two clock generation circuits work separately, which means that their generated clocks are not in a direct correlation. However, the reception end needs to recover the data delivered by the transmission end correctly, and thus the clock generation circuit in the reception end should generate a clock which is similar to or somehow related to the clock of the transmission end. But since the clock generation basis of the reception end (e.g. a crystal oscillator) is different from the clock generation basis of the transmission end (e.g. another crystal oscillator), the clock frequencies thereof are unavoidably different from each other. Therefore, the reception end needs to perform clock adjustment every few moments to thereby retrieve an optimal sampling position for sampling data correctly. According to the current art, the reception end uses its clock generation circuit to generate several clocks having the same frequency but different phases, picks an optimal sampling clock among the clocks by analyzing the sampled data, and then samples the following data according to the optimal sampling clock. As described before, the reception end needs to do clock adjustment every few moments for compensating the frequency difference between it and the transmission end; therefore, when the reception end detects deterioration in the sampled data, it will select another clock having a different phase among the aforementioned several clocks to use it as the updated optimal sampling clock for sampling the following data, so as to make sure that the sampled data remain acceptable.

However, in order to save power consumption, some Ethernet network reception end will shut down partial components (e.g. the phase lock loop in the clock generation circuit) in the leisure time to save power. But the reception end also has to return to normal work immediately when data are coming in, which means that the reception end has to quickly choose the optimal sampling clock again for sampling data. Because the phase lock loop, for example, which was shut down and restarted through the power saving process, might output an incorrect clock or couldn't continue the earlier work smoothly, sampling error consequence could therefore happen to the back-end circuits. As a result, the reception end must find the optimal sampling clock among the aforementioned several clocks according to the sampled data again. This repeated process not only consumes time but also lowers the power saving effect.

SUMMARY OF THE INVENTION

Regarding the above description, a purpose of the present invention is to provide a phase calibration device and a phase calibration method to improve the prior art.

Another purpose of the present invention is to provide a phase calibration device and a phase calibration method to rapidly perform phase calibration.

The present invention discloses a phase calibration device. According to an embodiment of the invention, the phase calibration device comprises: an oscillator for generating a reference clock; a phase lock loop for generating an input clock according to the reference clock; a multiphase clock generator for generating a plurality of output clocks according to the input clock in which the output clocks have the same frequency but different phases; a selector for selecting one of the plurality of output clocks as an operation clock; an analog-to-digital convertor for performing analog-to-digital conversion to input data according to the operation clock to thereby generate a conversion result; a control circuit for generating one or more parameters according to the conversion result and controlling the selector to do selection; and a phase calibration circuit for providing a calibration signal for the multiphase clock generator according to the reference clock and a reset signal from the control circuit after turning off and then turning on the phase lock loop, and for outputting the input clock from the phase lock loop to the multiphase clock generator according to the calibration signal, wherein the multiphase clock generator regenerates the plurality of output clocks in accordance with the calibration signal and the input clock while the control circuit controls the selector in light of the one or more parameters to select one of the output clocks as the operation clock.

According to an embodiment of the present invention, the aforementioned one or more parameters comprise a timing parameter, an optimal sampling phase parameter and a phase adjustment parameter.

According to an embodiment of the present invention, the aforementioned control circuit comprises a counter for generating a count value. The control circuit can generate a comparison result according to the count value and the timing parameter, and then controls the aforementioned selector to do selection according to the comparison result and the phase adjustment parameter.

According to an embodiment of the present invention, the phase calibration circuit comprises: a calibration signal generating circuit coupled to the control circuit and the oscillator for generating the calibration signal according to a reset signal from the control circuit and the reference clock from the oscillator; and a clock control circuit coupled to the phase lock loop and the calibration signal generating circuit for receiving the input clock from the phase lock loop and outputting the input clock to the multiphase clock generator according to the calibration signal so that the multiphase clock generator generates a plurality of output clocks accordingly.

The present invention further discloses a phase calibration method which can be carried out by a phase calibration device. According to an embodiment of the invention, the phase calibration method comprises: using an oscillator to generate a reference clock; generating an input clock according to the reference clock while the frequency of the input clock is different from the frequency of the reference clock; generating a plurality of output clocks according to the input clock while the plurality of output clocks has the same frequency but different phases; selecting one of the plurality of output clocks as an operation clock; performing analog-to-digital conversion to input data according to the operation clock to thereby generate a conversion result; generating and storing one or more parameters according to the conversion result; stopping generating the input clock; regenerating the input clock; providing a calibration signal according to the reference clock and a reset signal; after regenerating the input clock, outputting the input clock according to the calibration signal; regenerating the plurality of output clocks according to the calibration signal and the input clock; and outputting one of the output clocks as the operation clock according to the one or more parameters.

According to an embodiment of the present invention, the above-mentioned calibration method further comprises a step of generating a count value; meanwhile, the step of outputting one of the output clocks in accordance with the one or more parameters comprises: selecting one of the output clocks as the operation clock according to the count value and the one or more parameters.

These and other objectives of the present invention will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The following description uses language by referring to terms of the filed of this invention. If any term is defined in the specification, such term should be explained accordingly. Besides, the connection between objects or events in the disclosed embodiments can be direct or indirect provided that these embodiments are still applicable under such connection. The mentioned "indirect" means that an intermediate object or a physical space is existed between the objects, or an intermediate event or a time interval is existed between the events. In addition, the following description relates to phase calibration, and thus the known detail in this filed will be omitted if such detail has little to do with the features of the present invention. Furthermore, the shape, size, and ratio of any element and the step sequence of any flow chart in the disclosed figures are just exemplary for understanding, not for limiting the scope of this invention.

Besides, each embodiment in the following description includes one or more features; however, this doesn't mean that one carrying out the present invention should make use of all the features of one embodiment at the same time, or should only carry out different embodiments separately. In other words, if an implementation derived from one or more of the embodiments is applicable, a person of ordinary skill in the art can selectively make use of some or all of the features in one embodiment or selectively make use of the combination of some or all features in several embodiments to have the implementation come true, so as to increase the flexibility of carrying out the present invention.

The present invention discloses a phase calibration device and a phase calibration method. The phase calibration device and method can rapidly determine an operation clock with an optimal sampling phase or a phase in compliance with a predetermined requirement for sampling data. The phase calibration device and method are applicable to any data recovery device like an Ethernet network reception device; however, this is not a limitation, just for understanding of the present invention. People of ordinary skill in the art can choose components or steps equivalent to those described in this specification to realize the present invention, which means that the scope of this invention is not limited to the embodiments in the specification. Since some or all elements of the phase calibration device of the present invention could be known; therefore, the detail of such elements will be omitted provided that the omission nowhere dissatisfies the specification and enablement requirements. Besides, the phase calibration method can be carried out by the phase calibration device of this invention or other known or new devices; likewise the following description will abridge the hardware details or well-known parts of the method provided that the disclosure still satisfies the specification and enablement requirements.

Figure 1:
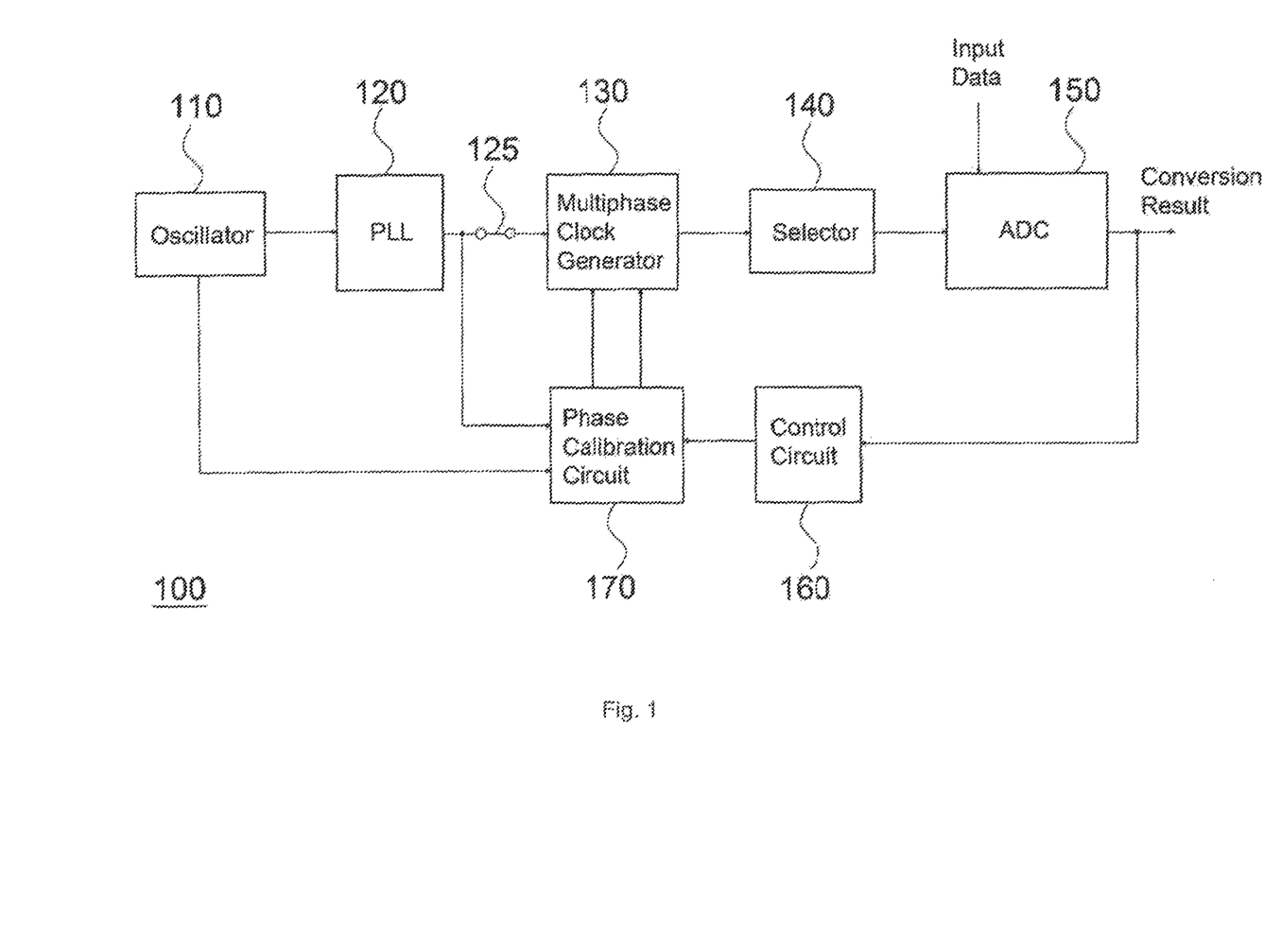
FIG. 1 illustrates an embodiment of the phase calibration device of the present invention.

Please refer to FIG. 1 which illustrates an embodiment of the phase calibration device of the present invention. The embodiment is applicable to a data sampling device/data recovery device (e.g. an Ethernet network reception device); more specifically, it can be used to recover an operation clock with an optimal sampling phase or in compliance with a predetermined requirement for sampling data. As shown in FIG. 1, the phase calibration device 100 of the present invention comprises an oscillator 110 for generating a reference clock; the oscillator 110 could be a crystal oscillating component, a CMOS oscillating component or any appropriate oscillating component. In fact, any device or circuit that can generate a stable reference clock is applicable to the oscillator 110 of the present invention provided that the embodiment remains practicable. The phase calibration device 100 further comprises: a phase lock loop (PLL) 120 coupled to the oscillator 110 for generating an input clock according to the reference clock in which the frequencies of the input clock and the reference clock are different, and the phase lock loop 120 can be a known or new phase lock loop provided that the embodiment remains practicable; a multiphase clock generator 130 coupled to the phase lock loop 120 for generating a plurality of output clocks according to the input clock in which the output clocks have the same frequency but different phases, and the multiphase clock generator 130 can be a known or new multiphase clock generator like a voltage control delay line or a delay lock loop provided that the embodiment remains practicable; a selector 140 coupled to the multiphase clock generator 130 for selecting one of the output clocks as an operation clock while the selector 140 can be a known multiplexer or some known or new selecting circuit; an analog-to-digital convertor (ADC) 150 coupled to the selector 140 for performing analog-to-digital conversion to an input data according to the operation clock to thereby generate a conversion result while similarly the analog-to-digital convertor 150 can be realized through a known or new analog-to-digital converting circuit provided that the embodiment remains practicable; a control circuit 160 (e.g. a programmable logic controller) coupled to the analog-to-digital convertor 150 and the selector 140 for generating and storing one or more parameters according to the conversion result and controlling the selector to do selection, wherein the one or more parameters includes an optimal sampling phase parameter, a timing parameter and a phase adjustment parameter which are examples instead of restriction to the present invention while the number or purpose of the one or more parameters could be determined by user's design; and a phase calibration circuit 170, coupled to the aforementioned oscillator 110, phase lock loop 120, multiphase clock generator 130 and controller 160, for providing a calibration signal for the multiphase clock generator 130 according to the control of the control circuit 160 and the reference clock from the oscillator 110 after turning off and restarting the phase lock loop 120, and outputting the input clock from the phase lock loop 120 to the multiphase clock generator 130 according to the calibration signal; in the meantime, the multiphase clock generator 130 regenerates the plurality of output clocks according to the calibration signal and the input clock and outputs the regenerated output clocks to the selector 140, and then the control circuit 160 controls the selector 140 to choose one of the output clocks as the operation clock according to the one or more parameters.

On the basis of the above description, in the present embodiment, the control circuit 160 will control the selector 140 to use each of the output clocks by turns or in a predetermined order to thereby sample the input data for generating the aforementioned conversion result. Afterwards, the control circuit 160 will analyze the conversion result to determine the best one among the output clocks as the current operation clock; in other words, the control circuit 160 will determine one of the output clocks that can achieve the best sampling effect or the sampling effect conforming to a preset requirement as the operation clock. For instance, the control circuit 160 will use a part or the whole of N output clocks $Clk_0$, $Clk_1$, $Clk_2$ ... $Clk_{N-2}$, $Clk_{N-1}$ by turns or in a predetermined order to obtain the conversion result, and determine $Clk_k$ as the current best operation clock according to the good and bad in the conversion result, wherein N is an integer greater than 1 and the suffix k is a value between 0 and N−1 (including 0 and N−1) that represents the aforementioned optimal sampling phase parameter. Besides, the control circuit 160 will also determine how long it takes that the quality of the conversion result descends to a predetermined threshold by analyzing the conversion result, and will control the selector 140 to re-select another clock among the output clocks with a different phase as the renewed operation clock when reaching the predetermined threshold. For example, the control circuit 160 can analyze the conversion result to find that the conversion result becomes unacceptable after using the output clock $Clk_k$ as the operation clock for a period 2 T, which means that after the time 2 T went by, the clock with the best sampling phase will no longer be $Clk_k$, but become $Clk_{k-m}$ instead. Therefore, in order to make sure that the conversion result stays correct, after a period less than 2 T (e.g. a period T, a half the period 2 T), the control circuit 160 will control the selector 140 to select the clock $Clk_{k-m}$ as the updated operation clock $Clk_k$, that is to say that the control circuit 160 will renew the optimal sampling phase parameter from k to k−m every period T in which m is an integer between 1 and N−1 representing the aforementioned phase adjustment parameter. Moreover, if the value of k−m is less than zero (because the value of k will be updated as time goes by and thus may be less than m), the present embodiment will have k−m become N+(k−m), so as to make the value of k−m remain between 0 and N−1. Please note that after treating the clock $Clk_{k-m}$ as the renewed operation clock $Clk_k$, the following clock adjustment process could be derived from the above description. Please also note that the specific period 2 T is exemplary; people of ordinary skill in the art can set a different period according to a design rule or an implementation requirement, for instance: the period 2 T can be replaced with xT (wherein x is a positive integer). Please further note that the clock $Clk_{k-m}$ could be represented by $Clk_{k+m'}$ (wherein m' is an integer between 1 and N−1); in other words, when the period T passes by, the control circuit 160 will update the optimal sampling phase parameter from k to k+m', so as to control the selector 140 to output the clock $Clk_{k+m'}$ as the latest operation clock $Clk_k$; meanwhile, if the value of k+m' is more than or equal to N, the present embodiment will change the value of k+m' to (k+m')−N so that the clock $Clk_{k+m'}$ will certainly correspond to one of the outputting clocks $Clk_0$, $Clk_1$, $Clk_2$ ... $Clk_{N-2}$, $Clk_{N-1}$. Furthermore, after the control circuit 160 determines the values of k, T and m, it will use a storage device (e.g. a plurality of registers) to store these values for rapidly recovering the operation clock after turning off and restarting the phase lock loop 120.

Based on the above description, when the phase calibration device 100 enters an economic mode or a mode that needs some circuits of the phase calibration device 100 to be turned off, the phase calibration device 100 will shut off the phase lock loop 120, and restart it according to a wake-up setting or a predetermined time. However, in consideration of that the phase lock loop 120 may output an incorrect clock, provide an abnormal frequency, or succeed the previous operation in an incorrect manner after it is turned off and on, which means that the back-end circuits can't trust in the operation clock due to the lack of a correct clock basis, the aforementioned phase calibration circuit 170 will provide a calibration signal from the multiphase clock generator 130 in connection with the trustable reference clock of the oscillator 110 under the control of the control circuit 160, and then output the input clock from the phase lock loop 120 to the multiphase clock generator 130 in response to the calibration signal (while the phase lock loop 120 doesn't directly provide the input clock for the multiphase clock generator 130 through switching off a switch 125). Afterwards, the multiphase clock generator 130 regenerates the plurality of output clocks $Clk_0$, $Clk_1$, $Clk_2$ ... $Clk_{N-2}$ and $Clk_{N-1}$ according to the calibration signal and the input clock, and then outputs these output clocks to the selector 140; consequently, the control circuit 160 controls the selector 140 to pick one of the output clocks (e.g. the output clock $Clk_k$) as the operation clock according to the one or more parameters (e.g. the optimal sampling phase parameter k which will be updated by time). Since the output clocks are related to the reference clock of the oscillator 110 through the calibration signal, the output clocks are therefore built on a correct basis.

Additionally, if the multiphase clock generator 130 adopts a digital logic structure (e.g. a structure based on one or more D flip-flops), it can execute a reset process or restore the operation according to the aforementioned calibration signal, for instance: if the calibration signal is at a low level, the digital logic structure execute the reset process (e.g. a process to stop operation); if the calibration is at a high level, the digital logic structure starts or keeps the operation). Accordingly, the multiphase clock generator 130 can stop or start using the input clock from the calibration circuit 170 to generate the plurality of output clocks $Clk_0$, $Clk_1$, $Clk_2$ ... $Clk_{N-2}$ and $Clk_{N-1}$. On the other hand, if the multiphase clock generator 130 adopts an analog structure (e.g. a voltage control delay line), it can be turned off or on by the calibration signal. For instance, if the calibration signal is at a low level, the power of the analog structure is shut down; if the calibration signal is at a high level, the power of the analog structure is turned on. As a result, the multiphase clock generator 130 can stop or start receiving the input clock from the calibration circuit 170 as the power is turned off or on. In another word, the calibration signal can control the phase calibration circuit 170 for outputting the input clock to the multiphase clock generator 130, and simultaneously enable the multiphase clock generator 130 for receiving the input clock.

Besides, in the present embodiment, because the control circuit 160 needs to compare the aforementioned timing parameter T with an ongoing timing result to thereby update the optimal sampling phase parameter from k to k−m every period T, the control circuit 160 comprises a counter or a timer (not shown) for generating a count value, and then compares the count value with the timing parameter T to thereby produce a comparison result. When the comparison result shows that the count value reaches the timing parameter T, the control circuit 160 will change the optimal sampling phase parameter k into k−m according to the one or more parameters (i.e. the phase adjustment parameter m in this embodiment), and then controls the selector 140 to output the operation clock $Clk_k$ corresponding to the optimal sampling phase parameter when the phase lock loop 120 is in operation. Please note that since the value of k will be updated by time, the operation clock $Clk_k$ at this moment may be different from the operation clock $Clk_k$ outputted by the selector previously. Please also note that when the count value reaches the timing parameter T, the said counter will be reset to do the count again. However, the above description is exemplary; other manners that can achieve the same counting effect are applicable to this invention.

The mentioned embodiment continually updates the optimal sampling phase parameter k to ensure that the selector 140 outputs the clock leading to the best data sampling effect. However, people having ordinary skill in the art can utilize other equivalent manners to update the optimal sampling phase parameter k in accordance with the disclosure of the present invention. For instance, after turning off the phase lock loop 120, the control circuit 160 can stop updating the optimal sampling phase parameter k and use another counter instead to accumulate a number a representing the past time. Afterwards, when the phase lock loop 120 is restarted, the number a can be used to update the optimal sampling phase parameter k in the manner equivalent to the following equation:

$$k=k-\text{INT}\{\text{MOD}(\alpha \times m, N)\},$$

wherein the parameters m and N respectively stand for the aforementioned phase adjustment parameter and the number of output clocks generated by the multiphase clock generator 130, the parameter INT means integer operation, the parameter MOD means modulo operation, the parameter k at the left of the equal sign represents the updated optimal sampling phase parameter, and the parameter k at the right of the equal sign represents the pre-existing optimal sampling phase parameter stored at the time of the phase lock loop 120 shut down. Moreover, as described before, if the updated optimal sampling phase parameter k is less than zero, the control circuit 160 will make the updated parameter k (i.e. k−INT{MOD($\alpha \times m$, N)}) be N+k, so as to keep the updated parameter k staying between 0 and N−1.

Figure 2:
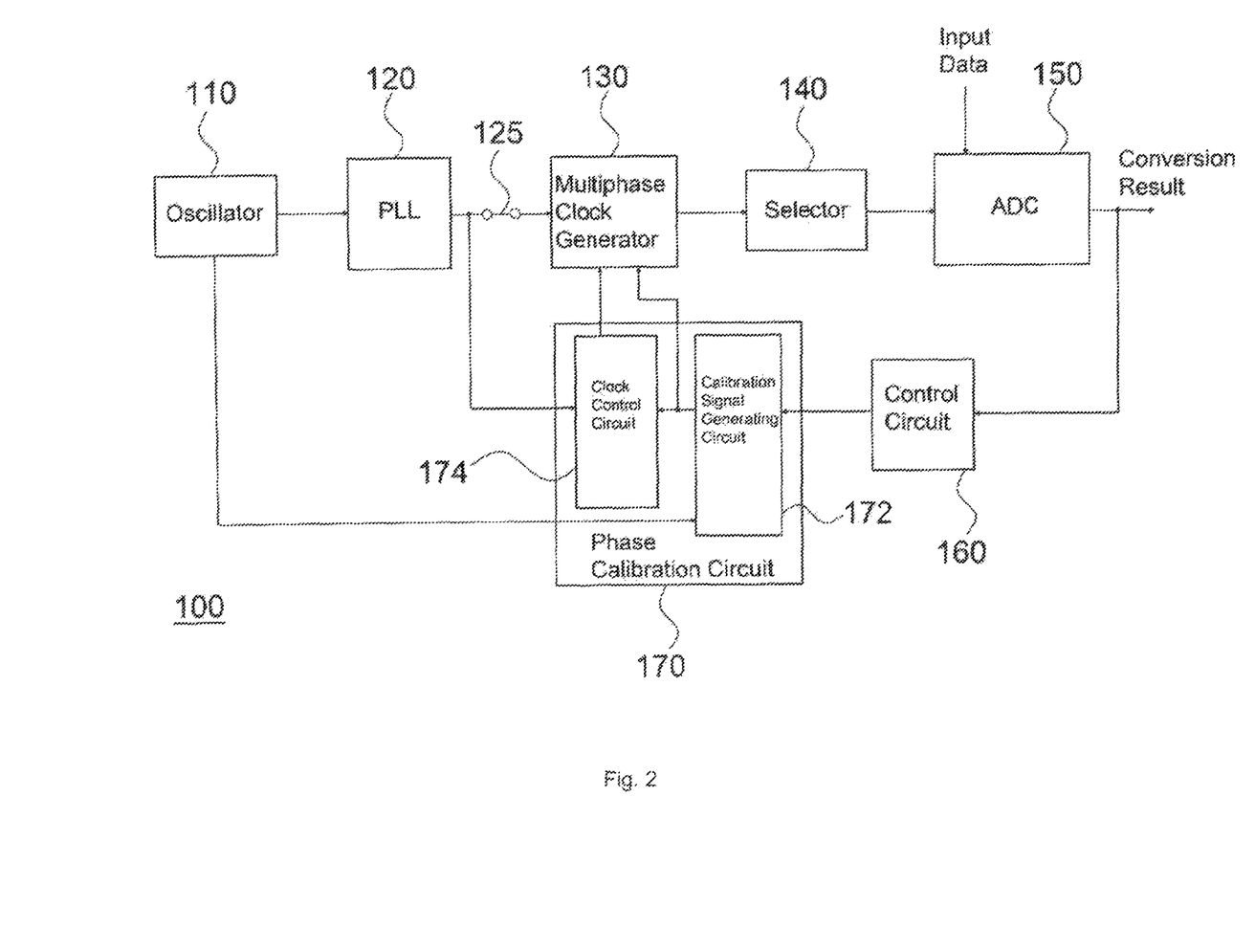
FIG. 2 illustrates the phase calibration circuit of FIG. 1.
Figure 3:
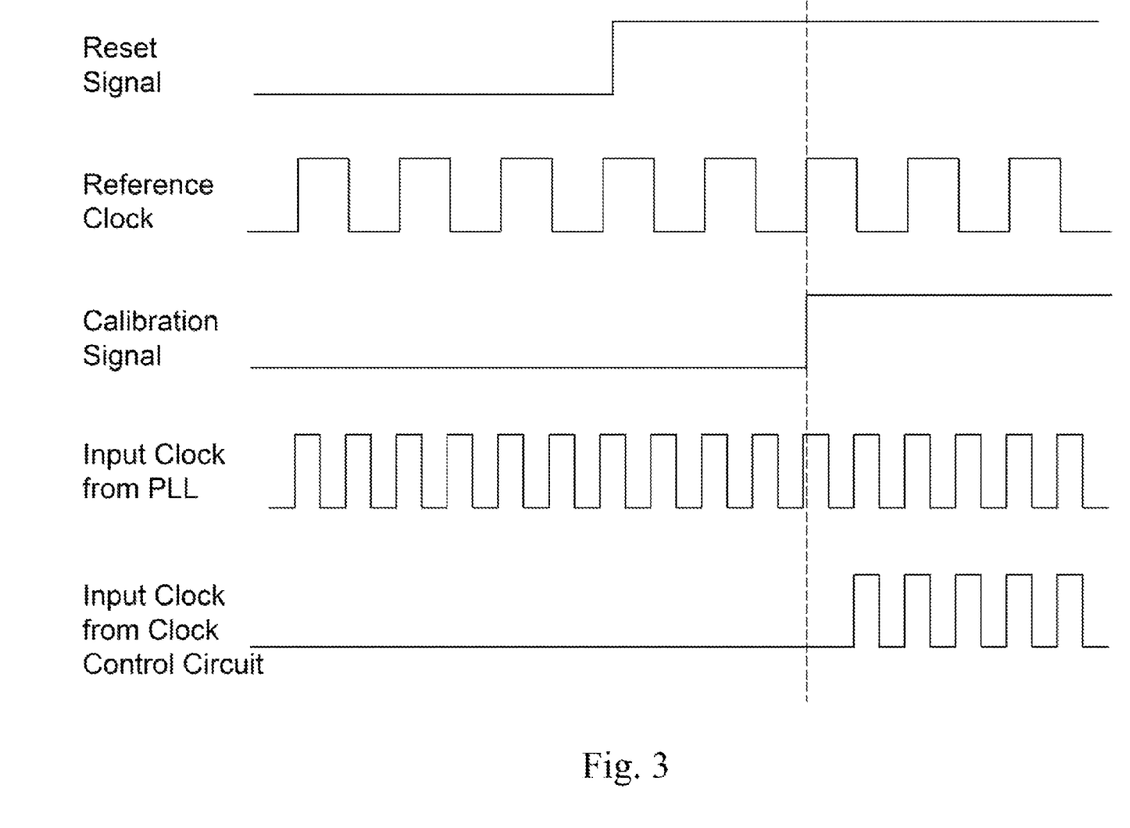
FIG. 3 illustrates a timing diagram of the phase calibration circuit of FIG. 1.

Please refer to FIG. 2 and FIG. 3 which illustrate the phase calibration circuit 170 of FIG. 1 and the signal timing diagram of the phase calibration circuit 170, respectively. As shown in FIG. 2, the phase calibration circuit 170 comprises: a calibration signal generating circuit 172 coupled to the aforementioned control circuit 160, the oscillator 110 and the multiphase clock generator 130 for generating the calibration signal according to a reset signal produced by the control circuit 160 and the reference clock produced by the oscillator 110; and a clock control circuit 174 coupled to the phase lock loop 120, the calibration signal generating circuit 172 and the multiphase clock generator 130 for receiving the input clock produced by the phase lock loop 120 and outputting the input clock to the multiphase clock generator 130 according to the calibration signal. Besides, as shown in FIG. 3, when the control circuit 160 sends the reset signal (e.g. the reset signal is pulled high), the calibration signal generating circuit 172 connects the reset signal with the rising edge of the reference clock to thereby generate the calibration signal (e.g. the calibration signal is pulled high to be synchronous with the reference clock). After the clock control circuit 174 receives the calibration signal at the high level, it outputs the input clock from the phase lock loop 120 to the multiphase clock generator 130 to regenerate the plurality of output clocks; more specifically, after the calibration signal is pulled high, the clock control circuit 174 will start to output the input clock to the multiphase clock generator 130 since the rising edge of the next coming input clock of the phase lock loop 120. Accordingly, the input clock can be correctly aligned with the reference clock according to the calibration signal, so that the plurality of output clocks derived from the input clock can be connected with the reference clock to thereby have a right clock basis.

Please note that the calibration signal generating circuit 172 of FIG. 2 can be carried out through two stages of D flip flops. Therefore, after the reset signal is pulled high, the calibration signal will be pulled high concurrently with the following second rising edge of the reference clock (while more detail could be found thorough FIG. 4 and the description thereof). However, the calibration signal generating circuit 172 can also be realized by one or more stages of D flip flops (or other logic circuits with the equivalent function). For example, if the calibration signal generating circuit is realized through one stage of D flip flop, after the reset signal is pulled high, the calibration signal will be consequently pulled high with the following first rising edge of the reference clock. Although this example can accelerate the generation of the calibration signal, but might degrade the circuit stability; hence, people of ordinary skill in the art can choose the best solution according to the pros and cons of different designs.

Figure 4:
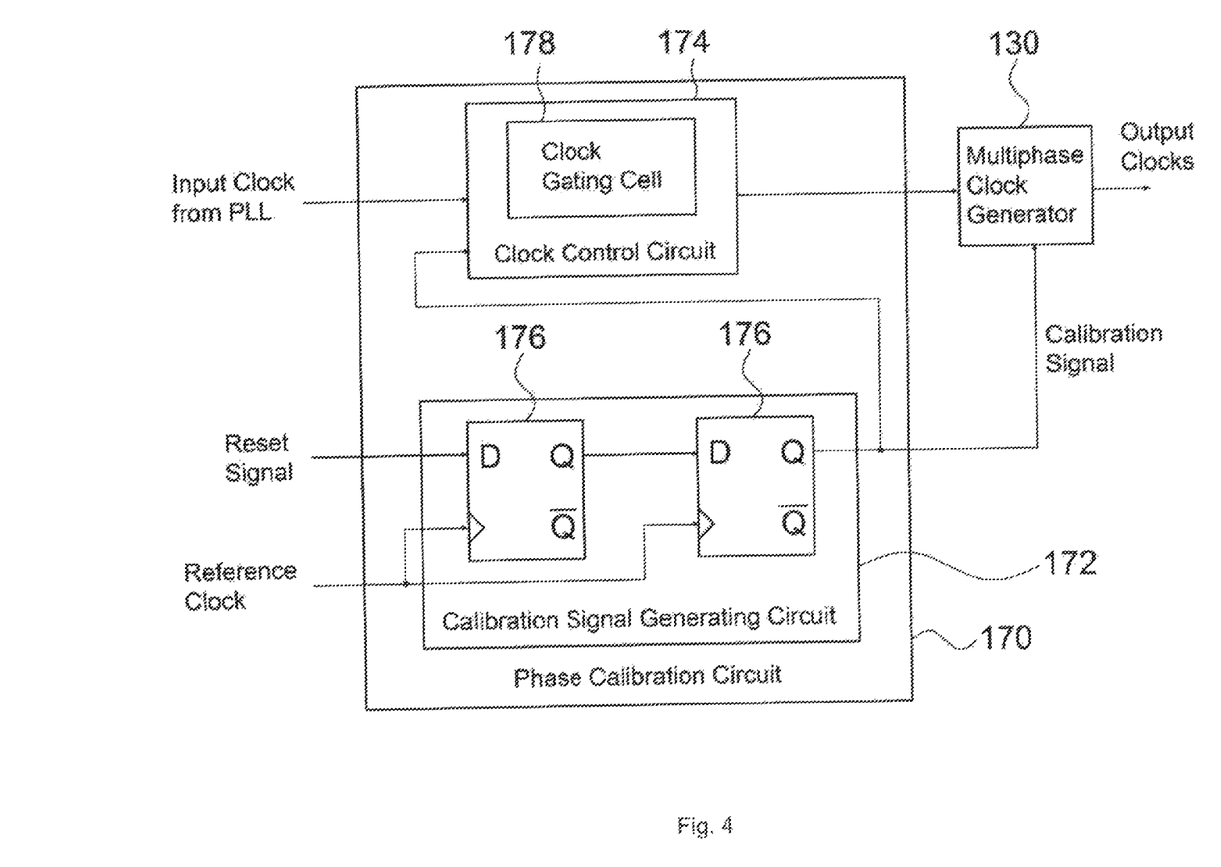
FIG. 4 illustrates an embodiment of the calibration signal generating circuit and clock control circuit of FIG. 2.

Please refer to FIG. 4 which illustrates an embodiment of the calibration signal generator 172 and the clock control circuit 174 of FIG. 2. The calibration signal generator 172 can be carried out by two stages of D flip flops 176 or other known logic circuits, so as to associate the reset signal with an edge of the reference clock for generating the calibration signal. On the other hand, the clock control circuit 174 can be realized by a known clock gating cell 178, which can guarantee the relation between the input clock and the reference clock.

The present invention further discloses a phase calibration method. Please refer to FIG. 5 which illustrates an embodiment of the phase calibration method of the present invention. The embodiment can be carried out by the aforementioned phase calibration device 100 or any device that can bring the embodiment into practice. The embodiment comprises: using an oscillator (e.g. a crystal oscillator or a CMOS oscillator) to generate a reference clock (step S505); using a phase lock loop to generate an input clock according to the reference clock (step S510) in which the frequency of the input clock is different from the frequency of the reference clock; using a multiphase clock generator to generate a plurality of output clocks according to the input clock (step S515) while the plurality of output clocks has the same frequency and different phases; using a selector to select one of the output clocks as an operation clock (step S520); using an analog-to-digital convertor to perform analog-to-digital conversion to input data according to the operation clock for generating a conversion result (step S525); using a control circuit to generate and store one or more parameters according to the conversion result (step S530); turning off the phase lock loop to stop generating the input clock (step S535); restarting the phase lock loop to regenerate the input clock (step S540); using a phase calibration circuit to provide a calibration signal according to the reference clock and a reset signal of the control circuit (step S545); after regenerating the input clock, using the phase calibration circuit to output the input clock of the phase lock loop according to the calibration signal (step S550); using the multiphase clock generator to regenerate the plurality of output clocks according to the calibration signal and the input clock (step S555); and using the control circuit to control the selector to output one of the output clocks as the operation clock according to the one or more parameters (step S560).

Figure 5:
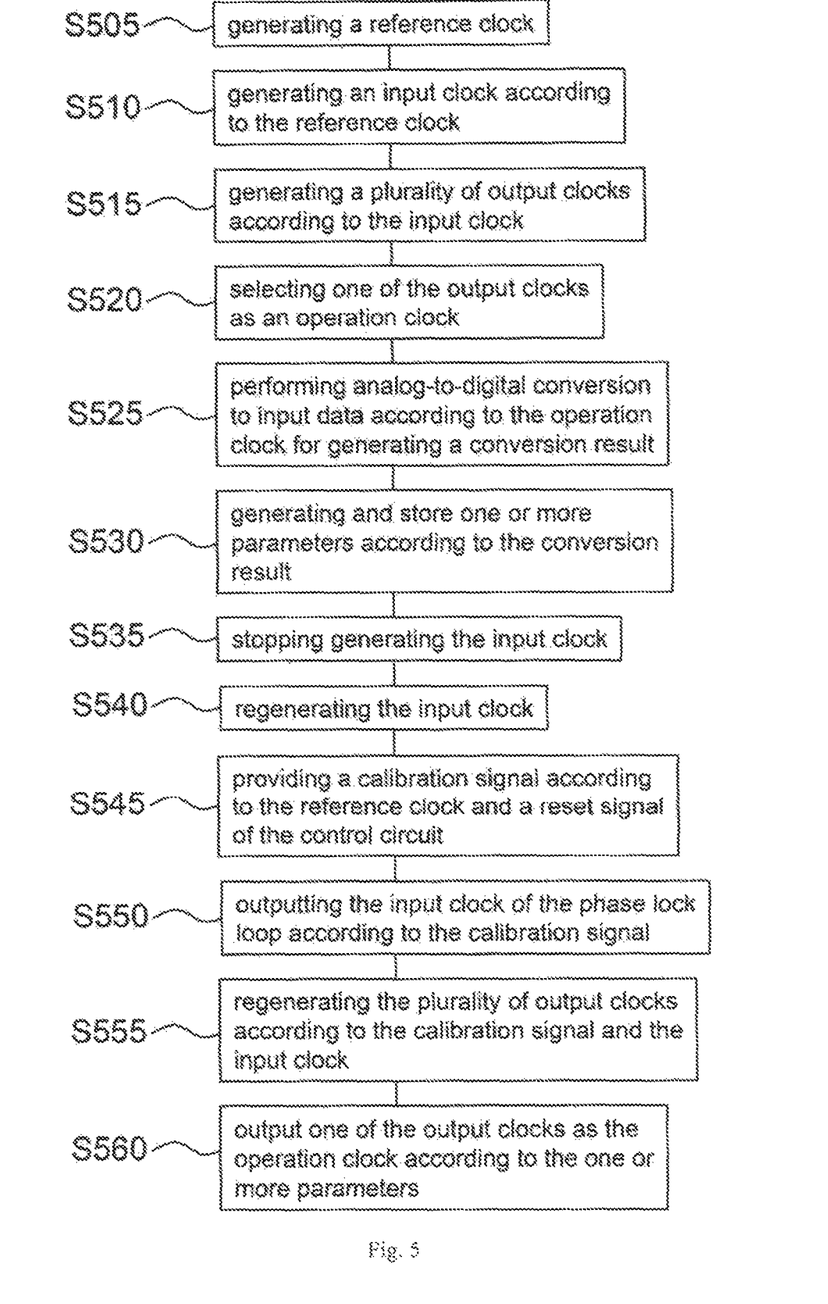
FIG. 5 illustrates an embodiment of the phase calibration method of the present invention.

In the present embodiment, the one or more parameters include an optimal sampling phase parameter, a timing parameter and a phase adjustment parameter; however, this is not a limitation to the present method, which means that the amount or purpose of the one or more parameters could be otherwise. Besides, the phase calibration method can further comprise: generating a count value which represents a duration; meanwhile, the step S560 comprises a step of outputting one of the output clocks as the operation clock according to the count value and at least one of the one or more parameters (e.g. the timing parameter). Furthermore, the phase calibration method can otherwise comprise: using a clock control circuit to output the input clock to the multiphase clock generator according to the calibration signal; in the meanwhile, the aforementioned step S555 can generate the plurality of output clocks according to input clock from the clock control circuit.

Please note that since one of ordinary skill in the art can fully understand the phase calibration method of FIG. 5 by referring to the description of the aforementioned phase calibration device 100, redundant or unnecessary description is therefore omitted provided that the method remains practicable.

To sum up, the phase calibration device and method of the present invention can rapidly determine an operation clock by using the parameter(s) stored in advance after turning off and then turning on a phase lock loop; at the same time, in order to avoid problems caused by the phase lock loop outputting an incorrect clock, providing an abnormal frequency, or incorrectly continuing the previous operation after restarting the phase lock loop, the present invention also utilizes a stable reference clock from an oscillator to generate a calibration signal, then makes use of the calibration signal for outputting the input clock from the phase lock loop, and then regenerates the plurality of output clocks according to the calibration signal and the input clock to allow the back-end circuits to pick a clock among the output clocks as the operation clock. Briefly, the regenerated output clocks are connected to the stable reference clock of the oscillator through the calibration signal to thereby lead to the correct operation clock.

The aforementioned descriptions represent merely the preferred embodiment of the present invention, without any intention to limit the scope of the present invention thereto. Various equivalent changes, alterations, or modifications based on the claims of present invention are all consequently viewed as being embraced by the scope of the present invention.

What is claimed is:

1. An phase calibration device, comprising:
   an oscillator for generating a reference clock;
   a phase lock loop coupled to the oscillator for generating an input clock according to the reference clock;
   a multiphase clock generator coupled to the phase lock loop for generating a plurality of output clocks according to the input clock in which the plurality of output clocks have the same frequency but different phases;
   a selector coupled to the multiphase clock generator for selecting one of the plurality of output clocks as an operation clock;
   an analog-to-digital convertor coupled to the selector for generating a conversion result by performing analog-to-digital conversion to input data according to the operation clock;
   a control circuit coupled to the analog-to-digital convertor and the selector for generating and storing at least one parameter according to the conversion result and controlling the selector to do selection; and
   a phase calibration circuit coupled to the oscillator, the phase lock loop, the multiphase clock generator and the control circuit for providing a calibration signal for the multiphase clock generator according to the reference clock and a reset signal from the control circuit after turning off and then turning on the phase lock loop, and for receiving the input clock from the phase lock loop to output the input clock to the multiphase clock generator according to the calibration signal, wherein the multiphase clock generator regenerates the plurality of output clocks in accordance with the calibration signal and the input clock while the control circuit controls the selector in light of the at least one parameter to select one of the output clocks as the operation clock.

2. The phase calibration device of claim 1, wherein the oscillator comprises a crystal oscillating component or a CMOS oscillating component.

3. The phase calibration device of claim 1, wherein the at least one parameter includes an optimal sampling phase parameter, a timing parameter and a phase adjustment parameter.

4. The phase calibration device of claim 3, wherein after the multiphase clock generator regenerates the plurality of output clocks according to the calibration signal and the input clock, the control circuit controls the selector to do selection according to the optimal sampling phase parameter.

5. The phase calibration device of claim 3, wherein the control circuit comprises a counter for generating a count value, generates a comparison result according to the count value and the timing parameter, and controls the selector to do selection according to the comparison result and the phase adjustment parameter.

6. The phase calibration device of claim 1, wherein the control circuit comprises a counter for generating a count value and controls the selector to do selection according to the count value and the at least one parameter.

7. The phase calibration device of claim 1, wherein the phase calibration circuit comprises:
   a calibration signal generating circuit coupled to the control circuit, the oscillator and the multiphase clock generator for generating the calibration signal according to the reset signal from the control circuit and the reference clock from the oscillator; and
   a clock control circuit coupled to the phase lock loop, the calibration signal generating circuit and the multiphase clock generator for receiving the input clock from the phase lock loop and outputting the input clock to the multiphase clock generator according to the calibration signal.

8. The phase calibration device of claim 7, wherein the calibration signal generating circuit comprises at least one logic circuit for associating the reset signal with an edge of the reference clock to thereby generate the calibration signal.

9. The phase calibration device of claim 7, wherein the clock control circuit comprises at least one clock gating cell for ensuring a relation between the input clock and the reference clock.

10. A phase calibration method, which can be realized through a phase calibration device, comprising:
   using an oscillator to generate a reference clock;
   generating an input clock according to the reference clock while the frequency of the input clock is different from the frequency of the reference clock;
   generating a plurality of output clocks according to the input clock while the plurality of output clocks has the same frequency but different phases;
   selecting one of the plurality of output clocks as an operation clock;
   performing analog-to-digital conversion to input data according to the operation clock to thereby generate a conversion result;
   generating and storing one or more parameters according to the conversion result;
   stopping generating the input clock;
   regenerating the input clock;
   providing a calibration signal according to the reference clock and a reset signal;
   after regenerating the input clock, outputting the input clock according to the calibration signal;
   regenerating the plurality of output clocks according to the calibration signal and the input clock; and
   outputting one of the output clocks as the operation clock according to the one or more parameters.

11. The phase calibration method of claim 10, wherein the one or more parameters includes an optimal sampling phase parameter, a timing parameter and a phase adjustment parameter.

12. The phase calibration method of claim 10, further comprising:
   generating a count value, wherein the step of outputting one of the output clocks according to the one or more parameters comprises: selecting one of the output clocks as the operation clock according to the count value and at least one of the one or more parameters.

* * * * *